United States Patent

(12) United States Patent
Nozaki

(10) Patent No.: US 9,080,732 B2
(45) Date of Patent: Jul. 14, 2015

(54) LIGHT EMITTING DEVICE AND VEHICLE LAMP

(71) Applicant: Stanley Electric Co., Ltd., Tokyo (JP)

(72) Inventor: Takahiko Nozaki, Tokyo (JP)

(73) Assignee: Stanley Electric Co., Ltd., Tokyo (JP)

(*) Notice: Subject to any disclaimer, the term of this patent is extended or adjusted under 35 U.S.C. 154(b) by 43 days.

(21) Appl. No.: 14/095,504

(22) Filed: Dec. 3, 2013

(65) Prior Publication Data

US 2014/0153276 A1    Jun. 5, 2014

(30) Foreign Application Priority Data

Dec. 3, 2012  (JP) ................................ 2012-264408

(51) Int. Cl.
*F21K 99/00* (2010.01)
*F21S 8/10* (2006.01)
*H01L 33/58* (2010.01)
*H01S 5/00* (2006.01)
*H01S 5/022* (2006.01)

(52) U.S. Cl.
CPC ................ *F21K 9/50* (2013.01); *F21S 48/115* (2013.01); *F21S 48/1225* (2013.01); *F21S 48/145* (2013.01); *H01L 33/58* (2013.01); *H01S 5/005* (2013.01); *H01S 5/02212* (2013.01)

(58) Field of Classification Search
CPC ............. F21K 99/00; F21K 9/00; F21K 9/52; F21K 9/50; F21S 8/10; F21S 48/1225; F21S 48/115; F21S 48/145; F21S 48/1241; F21S 48/1145; H01L 33/00; H01L 33/58; H01S 5/00; H01S 5/005; H01S 5/02212
See application file for complete search history.

(56) References Cited

U.S. PATENT DOCUMENTS

| | | | | |
|---|---|---|---|---|
| 2007/0195538 | A1* | 8/2007 | Hama et al. | 362/382 |
| 2011/0280032 | A1* | 11/2011 | Kishimoto | 362/538 |
| 2014/0003074 | A1* | 1/2014 | Kishimoto | 362/510 |
| 2014/0085923 | A1* | 3/2014 | Nakazato | 362/558 |
| 2014/0160782 | A1* | 6/2014 | Harada | 362/538 |
| 2014/0347874 | A1* | 11/2014 | Nakaya | 362/510 |

FOREIGN PATENT DOCUMENTS

JP    2010-165834 A    7/2010

* cited by examiner

*Primary Examiner* — Bao Q Truong
(74) *Attorney, Agent, or Firm* — Kenealy Vaidya LLP

(57) ABSTRACT

A light emitting device can include a base portion including a surface, a back surface, and a first through hole penetrating the surface and the back surface. A light-transmitting member can be fixed to the surface so as to cover the first through hole. A semiconductor light emitting element can emit light to pass through the first through hole and for irradiating the light-transmitting member. An optical system can be provided for condensing the light from the semiconductor light emitting element and locally irradiating the light-transmitting member with the light. A foil body can be provided and can include a second through hole for light emitted from the light-transmitting member to pass through and has elasticity. The light-transmitting member can be sandwiched between the foil body around the second through hole and the base portion with part of the light-transmitting member exposed from the second through hole.

29 Claims, 12 Drawing Sheets

LIGHT EMITTING DEVICE AND VEHICLE LAMP

This application claims the priority benefit under 35 U.S.C. §119 of Japanese Patent Application No. 2012-264408 filed on Dec. 3, 2012, which is hereby incorporated in its entirety by reference.

TECHNICAL FIELD

The presently disclosed subject matter relates to a light emitting device, and more particularly to a light emitting device and a vehicle lamp having a structure such as a semiconductor light emitting element (for example, semiconductor laser light source) and a light-transmitting member which can be combined with each other.

BACKGROUND ART

A light emitting device having a structure in which a semiconductor light emitting element (for example, semiconductor laser light source) and a light-transmitting member are combined with each other has heretofore been proposed (for example, see Japanese Patent Application Laid-Open No. 2010-165834).

As shown in FIG. 1, a light emitting device 200 described in Japanese Patent Application Laid-Open No. 2010-165834 can include a semiconductor laser light source 210, a light-transmitting member 220 (containing phosphor), a condenser lens 230, a holder 240, and other members. The light-transmitting member 220 can be located at a distance from the semiconductor laser light source 210. The condenser lens 230 can be arranged between the semiconductor laser light source 210 and the light-transmitting member 220. The holder 240 can hold the semiconductor laser light source 210, the light-transmitting member 220, and the condenser lens 230.

In the light emitting device 200 described in Japanese Patent Application Laid-Open No. 2010-165834, the laser light from the semiconductor laser light source 210 can be condensed by the condenser lens 230 and pass through a through hole 242. The light-transmitting member 220 arranged over the through hole 242 can be locally irradiated with the laser light. The light-transmitting member 220 irradiated with the laser light can emit both the transmitted laser light from the semiconductor laser light source 210 and light (luminescence) that is emitted due to excitation of phosphor by the laser light from the semiconductor laser light source 210. From the viewpoint of preventing the light-transmitting member 220 from falling off and allowing the laser light to be directly emitted to the outside, the light-transmitting member 220 is firmly fixed by a fixing member 250.

According to the light emitting device 200 having the above configuration, the light-transmitting member 220 can be prevented from falling off. However, the light-transmitting member 220 and the fixing member 250 experience repeated expansion and contraction because of heat generated by the locally irradiating laser light from the semiconductor laser light source. This causes the problem in which the light-transmitting member 220 and the fixing member 250 are prone to embrittlement (the light-transmitting member is thus prone to break).

SUMMARY

The presently disclosed subject matter was devised in view of these and other problems and features in association with the conventional art. According to an aspect of the presently disclosed subject matter, a light emitting device can be provided in which the light-transmitting member can be prevented from falling off and in which the configuration of the light emitting device can suppress the embrittlement of the light-transmitting member (and the resulting break of the light-transmitting member) due to repetitive expansion and contraction of the light-transmitting member because of the heat generated by the locally irradiating light from the semiconductor light emitting element (for example, semiconductor laser light source), and a vehicle lamp using the light emitting device.

According to another aspect of the presently disclosed subject matter, a light emitting device can include: a base portion that includes a surface, a back surface on the opposite side, and a first through hole penetrating the surface and the back surface; a light-transmitting member that is fixed to the surface so as to cover the first through hole; a semiconductor light emitting element configured to emit light to pass through the first through hole and for the light-transmitting member to be irradiated with; an optical system configured to condense the light from the semiconductor light emitting element and locally irradiate the light-transmitting member with the light; and a foil body configured to include a second through hole for light emitted from the light-transmitting member to pass through and has elasticity, the light-transmitting member being sandwiched between the foil body around the second through hole and the base portion with part of the light-transmitting member exposed from the second through hole.

The presently disclosed subject matter according to the above described aspect can provide the following advantages.

Firstly, the light-transmitting member can be prevented from falling off. This advantage results from the fact that the light-transmitting member is sandwiched between the foil body (around the second through hole) and the base portion.

Secondly, the embrittlement of the light-transmitting member (and the resulting breaking of the light-transmitting member) can be suppressed while the light-transmitting member repeats expansion and contraction because of heat generated by the locally irradiating light from the semiconductor light emitting element (for example, semiconductor laser light source). This advantage results from the fact that the elastic foil body is used as a member for sandwiching (fixing) the light-transmitting member.

More specifically, suppose that the light-transmitting member is firmly fixed by using a member having no elasticity (or a member having little elasticity) as the member for sandwiching (fixing) the light-transmitting member. In such a case, the light-transmitting member undergoes stress each time the light-transmitting member expands/contracts. As a result, the embrittlement of the light-transmitting member (and the resulting breaking of the light-transmitting member) is facilitated.

In contrast, according to the above described aspect of the presently disclosed subject matter, the elastic foil body can be used as the member for sandwiching (fixing) the light-transmitting member. Each time the light-transmitting member expands/contacts, the foil body can make an elastic deformation to follow the expansion/contraction, whereby the application of stress to the light-transmitting member can be suppressed. Consequently, the embrittlement of the light-transmitting member (and the resulting breaking of the light-transmitting member) can be suppressed.

Thirdly, light output efficiency can be increased. This advantage results from the fact that the foil body having a substantially negligible thickness is used as the member for sandwiching (fixing) the light-transmitting member.

More specifically, suppose that the light-transmitting member is sandwiched (fixed) by using a member having more than a certain thickness. In such a case, part of the light emitted from the light-transmitting member through the second through hole is blocked by the inner wall of the second through hole. This lowers the light output efficiency.

In contrast, according to the above described aspect of the presently disclosed subject matter, the foil body having a substantially negligible thickness is used as the member for sandwiching (fixing) the light-transmitting member. The light emitted from the light-transmitting member through the second through hole will hardly be blocked by the inner wall of the second through hole. As a result, the light output efficiency can be increased.

Fourthly, the second through hole can be formed in an arbitrary shape. This advantage results from the fact that the second through hole is formed in the foil body which can be easily processed.

Fifthly, a light emission surface having an arbitrary shape (constituted by part of the light-transmitting member exposed from the second through hole) can be formed. The outline of the light emission surface is defined by the shape of the second through hole.

The second through hole may be formed in an appropriate shape, for example, according to the shape, size, and the like of an intended light distribution pattern. In such a manner, a light emission surface having a shape suitable for a predetermined light distribution pattern (for example, low-beam light distribution pattern) can be easily formed.

In the above described aspect of the presently disclosed subject matter, the light emitting device can further include a high reflectance member configured to cover at least part of a side surface of the light-transmitting member.

With the present configuration, the light output efficiency can be improved. This effect results from the fact that since the side surface of the light-transmitting member can be covered with the high reflectance member, light emitted from the side surface of the light-transmitting member is reflected from the high reflectance member to enter the light-transmitting member again.

The side surface of the light-transmitting member is not firmly fixed but covered with the high reflectance member which has elasticity (for example, white resin). Each time the light-transmitting member expands/contracts, the high reflectance member (for example, white resin) can make an elastic deformation to follow the expansion/contraction, whereby the application of stress to the light-transmitting member can be suppressed. As a result, the embrittlement of the light-transmitting member (and the resulting break of the light-transmitting member) can be suppressed.

In the above described aspect of the presently disclosed subject matter, the high reflectance member can be a white resin.

With this configuration, the light output efficiency can be improved. This effect results from the fact that since the side surface of the light-transmitting member can be covered with the white resin, the light emitted from the side surface of the light-transmitting member is reflected from the white resin to enter the light-transmitting member again.

The side surface of the light-transmitting member is not firmly fixed but covered with the white resin which has elasticity. Each time the light-transmitting member expands/contracts, the white resin can make an elastic deformation to follow the expansion/contraction, whereby the application of stress to the light-transmitting member can be suppressed. As a result, the embrittlement of the light-transmitting member (and the resulting break of the light-transmitting member) can be suppressed.

In the above described aspect of the presently disclosed subject matter, the surface can include a recess including a bottom surface in which the first through hole is formed; the light-transmitting member can be fixed to the bottom surface of the recess so as to cover the first through hole; and the high reflectance member can be arranged in a space defined by an inner wall and the bottom surface of the recess, the side surface of the light-transmitting member, and the foil body.

With this configuration, each time the high reflectance member (for example, white resin) expands/contracts because of heat generated by the locally irradiating light from the semiconductor light emitting element (for example, semiconductor laser light source), the foil body can make an elastic deformation to follow the expansion/contraction of the high reflectance member. As a result, the light-transmitting member can be held securely.

In the above described aspect of the presently disclosed subject matter, the light-transmitting member can be a wavelength conversion member including a diffusion layer and a wavelength conversion layer; the diffusion layer can be a layer that can include a first surface fixed to the surface so as to cover the first through hole and a second surface on the opposite side, and can diffuse the light from the semiconductor light emitting element with which the first surface is irradiated, so as to emit the resultant as diffusion light from the second surface; and the wavelength conversion layer can be a layer that can include a third surface joined to the second surface and a fourth surface on the opposite side, and can convert a wavelength of the diffusion light incident on the third surface, so as to emit the resultant from the fourth surface.

With this configuration, a drop in efficiency due to luminance saturation and temperature quenching can be suppressed. This effect results from the fact that the light from the semiconductor light emitting element condensed by the optical system (for example, condenser lens) is not incident on the wavelength conversion layer as local light. Instead, the light can be diffused by the diffusion layer and incident on the wavelength conversion layer as diffusion light having a generally uniform luminance distribution.

The luminance saturation refers to a phenomenon in which a fluorescence intensity does not increase with an increasing energy density of light (for example, laser light from a semiconductor laser light source) if the energy density of the light exceeds a certain value. The temperature quenching refers to a phenomenon in which the efficiency of the phosphor itself decreases due to heat generated by light (for example, laser light from a semiconductor laser light source) when the phosphor is excited by a high energy density like that of the semiconductor laser light source.

In the above described aspect of the presently disclosed subject matter, the foil body can be a metal foil.

With this configuration, a metal foil having a relatively high thermal conductivity can be used to provide a heat dissipation path for the heat generated by the locally irradiating light from the semiconductor light emitting element (for example, semiconductor laser light source). Consequently, phosphor excitation efficiency can be increased.

In the above described aspect of the presently disclosed subject matter, the foil body can include a reflection surface configured to control the light passing through the second through hole.

With this configuration, the distribution of the light passing through the second through hole can be controlled to form an intended light distribution pattern.

In the above described aspect of the presently disclosed subject matter, a thickness of the diffusion layer can be set so that the diffusion light emitted from the second surface has a generally uniform luminance distribution.

With this configuration, luminance variations can be improved. This effect results from the fact that the light from the semiconductor light emitting element condensed by the optical system (for example, condenser lens) is not incident on the wavelength conversion layer as local light. Instead, the light can be diffused by the diffusion layer and incident on the wavelength layer as the diffusion light having a generally uniform luminance distribution.

The optical system that can be configured to condense the light from the semiconductor light emitting element and locally irradiate the light-transmitting member with the light may be an optical system including a condenser lens that can condense the light from the semiconductor light emitting element and locally irradiate the light-transmitting member with the light. The optical system may be one including a condenser lens that condenses the light from the semiconductor light emitting element, and a light guide that can guide the light from the semiconductor light emitting element condensed by the condenser lens and locally irradiate the light-transmitting member with the light.

According to another aspect of the presently disclosed subject matter, a vehicle lamp can include the light emitting device according to any of the above matters; and an optical system that is configured to control light from the light emitting device to irradiate in front of a vehicle.

According to the presently disclosed subject matter, a light emitting device in which a light-transmitting member is prevented from falling off and which can suppress the embrittlement of the light-transmitting member (and the resulting break of the light-transmitting member) due to repetitive expansion and contraction of the light-transmitting member because of the heat generated by the locally irradiating light from the semiconductor light emitting element (for example, semiconductor laser light source), and a vehicle lamp using the light emitting device, can be provided.

BRIEF DESCRIPTION OF DRAWINGS

These and other characteristics, features, and advantages of the presently disclosed subject matter will become clear from the following description with reference to the accompanying drawings, wherein.

DESCRIPTION OF EXEMPLARY EMBODIMENTS

A description will now be made below to light emitting devices of the presently disclosed subject matter with reference to the accompanying drawings in accordance with exemplary embodiments.

Figure 1:
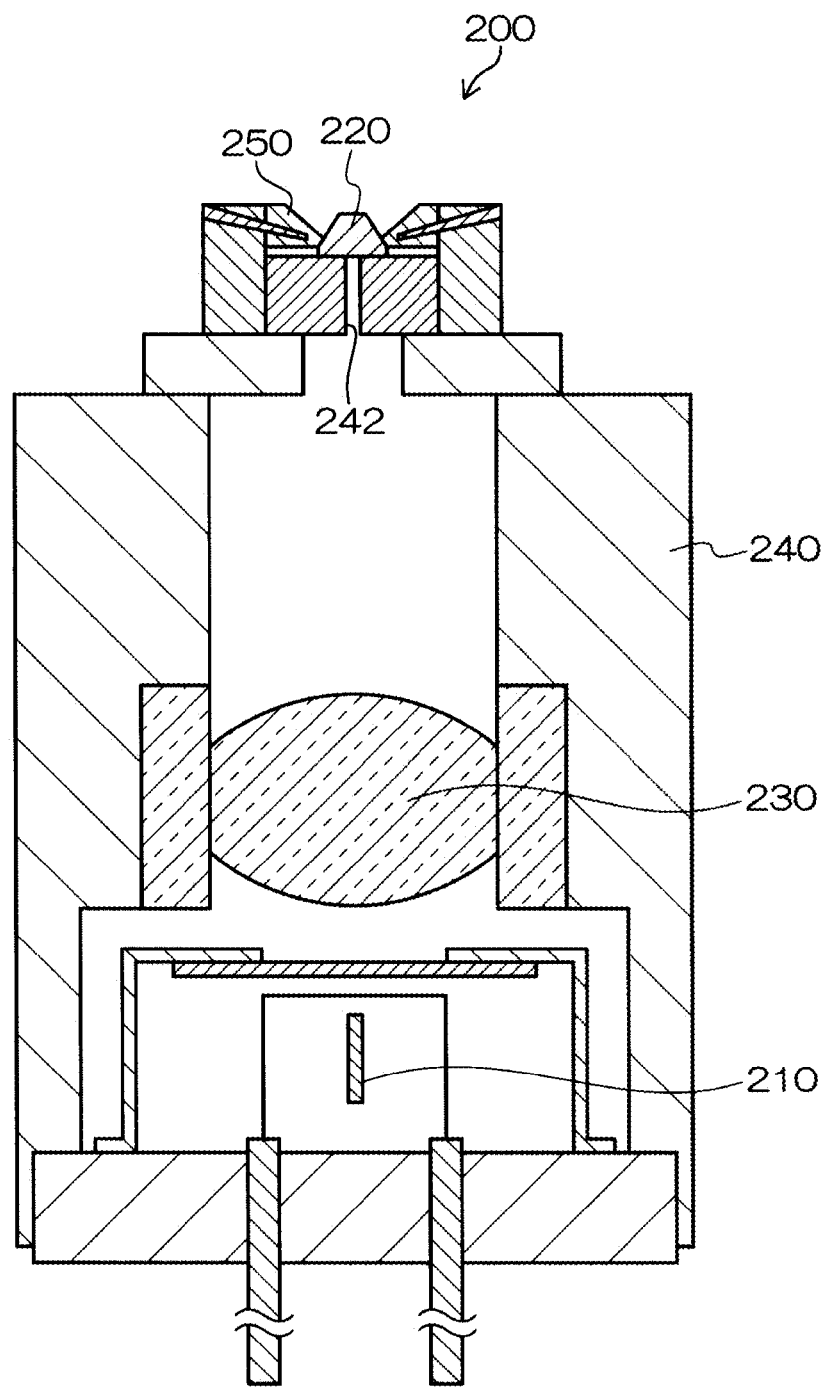
FIG. 1 is a sectional view of a conventional light emitting device.
Figure 2:
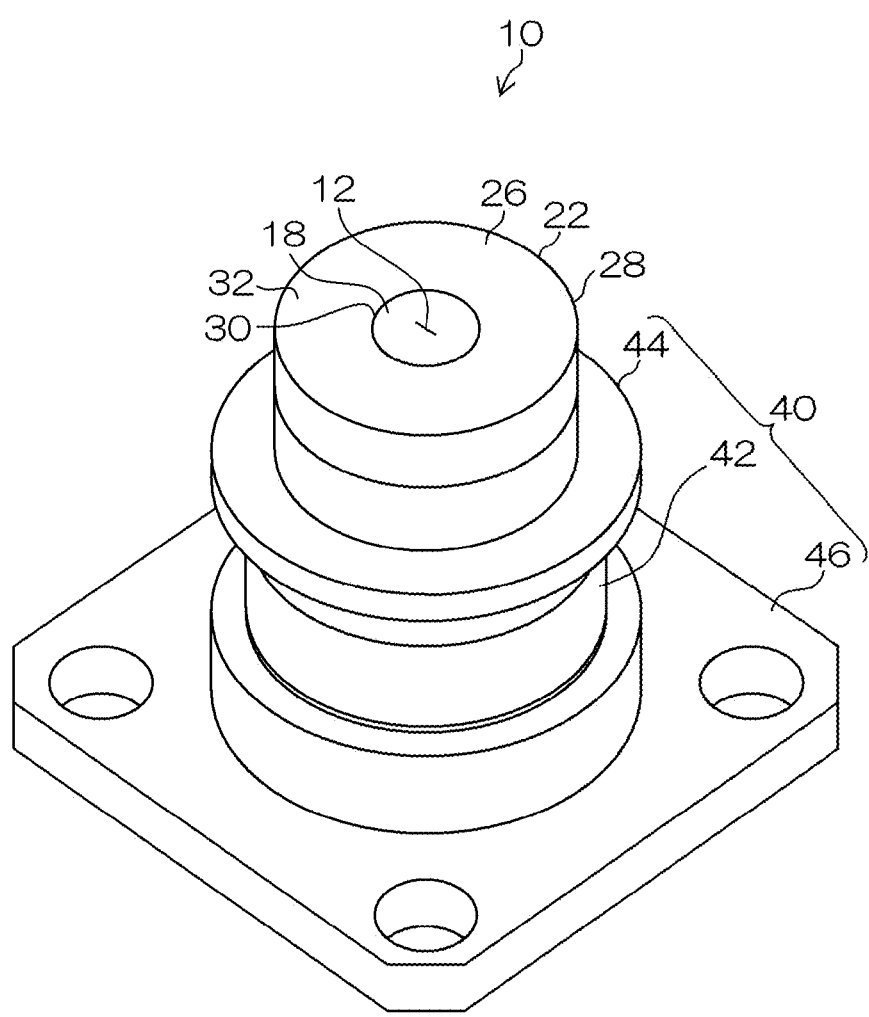
FIG. 2 is a perspective view of a light emitting device (a foil body being omitted) which is an embodiment made in accordance with principles of the presently disclosed subject matter.
Figure 3:
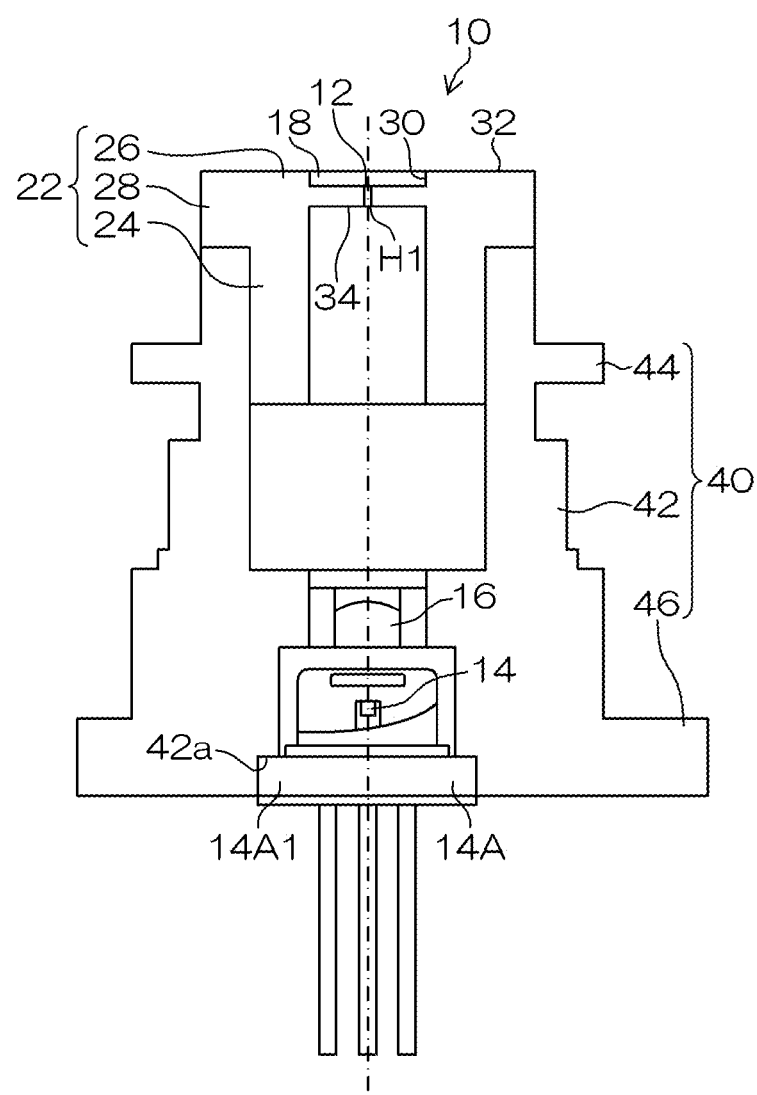
FIG. 3 is a longitudinal sectional view of the light emitting device of FIG. 2.
Figure 4:
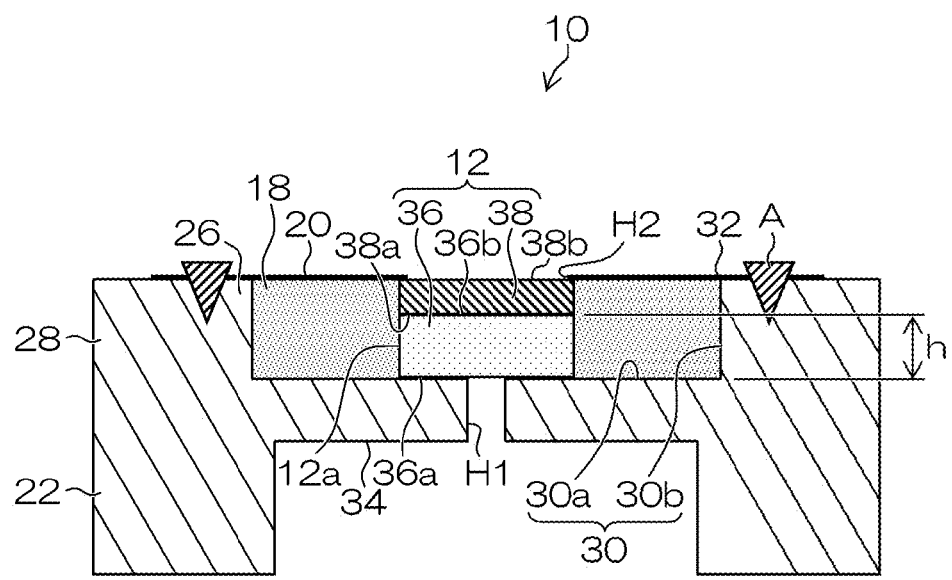
FIG. 4 is an enlarged partial sectional view near a first through hole of the light emitting device of FIG. 2.

FIG. 2 is a perspective view of a light emitting device 10 (a foil body 20 being omitted), according to an embodiment of the presently disclosed subject matter. FIG. 3 is a longitudinal sectional view of the same. FIG. 4 is an enlarged partial sectional view near a first through hole H1.

As shown in FIGS. 2 to 4, the light emitting device 10 can include a light-transmitting member 12, a semiconductor light emitting element 14, a condenser lens 16, a high reflectance member 18, the foil body 20, and holders for holding such components, composed of a first holder 22 and a second holder 40.

The first holder 22 can be made of metal such as stainless steel. A shown in FIG. 3, the first holder 22 can include a cylindrical tube portion 24, a circular base portion 26 blocking an upper open end of the tube portion 24, and a flange portion 28 arranged around an upper part of the tube portion 24.

As shown in FIG. 4, the base portion 26 can include a surface 32 including a recess 30, a back surface 34 on the opposite side, and the first through hole H1. The first through hole H1 can penetrate the surface 32 (a bottom surface 30a of the recess 30) and the back surface 34.

The light-transmitting member 12 can be a wavelength conversion member including a diffusion layer 36 (also referred to as a diffusion plate) and a wavelength conversion layer 38. The diffusion layer 36 may be omitted, in which case the entire light-transmitting member 12 may be composed of the wavelength conversion layer 38.

The diffusion layer 36 can be a layer including a lower surface 36a (corresponding to the first surface according to the presently disclosed subject matter) and an upper surface 36b (corresponding to the second surface according to the presently disclosed subject matter) on the opposite side. The lower surface 36a can be fixed to the surface 32 (the bottom surface 30a of the recess 30) so as to cover the first through hole H1. The diffusion layer 36 can diffuse light (in the present embodiment, laser light) from the semiconductor light emitting element 14 with which the lower surface 36a (corresponding to the first surface according to the presently disclosed subject matter) is locally irradiated (in a spot-like manner). The diffusion layer 36 can emit the resultant light as diffusion light from the upper surface 36b (corresponding to the second surface according to the presently disclosed subject matter).

For example, the diffusion layer 36 can be a layer of rectangular plate shape (for example, a rectangle of 0.4 mm×0.8 mm with a thickness of 300 μm to 400 μm), made of a composite body (for example, sintered body) of YAG (for example, 25%) and alumina $Al_2O_3$ (for example, 75%). In this example, the YAG is not doped with an activator (also referred to as luminescent center) such as cerium (Ce).

The light-transmitting member 12 (the lower surface 36a of the diffusion layer 36) and the surface 32 (the bottom surface 30a of the recess 30) can be bonded, for example, with a transparent adhesive (such as silicone and low-melting glass). Part of the lower surface 36a of the diffusion layer 36 can be exposed from the through hole H1.

The diffusion layer 36 may be any layer that diffuses the light from the semiconductor light emitting element 14 with which the lower surface 36a is locally irradiated, and emits the resultant light as diffusion light from the upper surface 36b. The shape of the diffusion layer 36 is not limited to the foregoing.

For example, the diffusion layer 36 may be a cylindrical columnar layer (for example, φ0.4 mm to 0.8 mm). The diffusion layer 36 may be a rectangular solid layer (for example, 0.3 mm to 0.6 mm across and 0.6 mm to 2.0 mm long). Layers of other shapes may be used.

The diffusion layer 36 may be any layer that diffuses the light from the semiconductor light emitting element 14 with which the lower surface 36a is locally irradiated, and emits the resultant as diffusion light from the upper surface 36b. The material of the diffusion layer 36 is not limited to the foregoing.

For example, the diffusion layer 36 may be a layer of a composite body of YAG and glass. The diffusion layer 36 may be a layer of bubble-dispersed alumina $Al_2O_3$ (or glass). Layers of other materials may be used.

The diffusion layer 36 can have the thickness of 300 μm to 400 μm from the following point of view.

The inventor of the present application has confirmed that the thickness h (see FIG. 4) of the diffusion layer 36 can be increased to improve luminance variations of the diffusion light emitted from the upper surface 36b of the diffusion layer 36 for uniform (or generally uniform) luminance distribution.

Figure 5A:
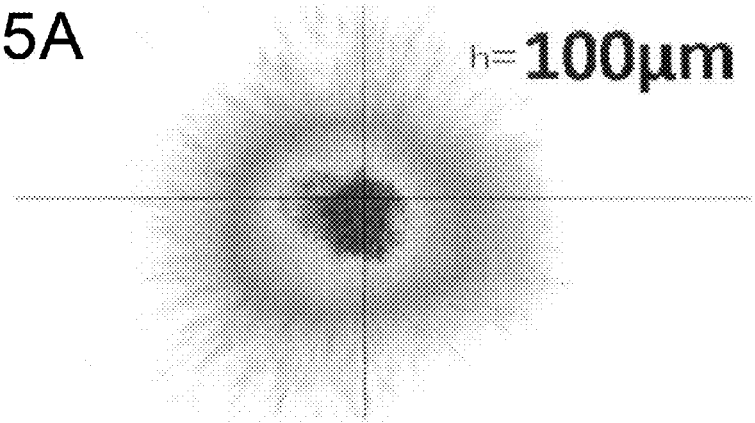
FIGS. 5A-5C show the luminance distributions of diffusion light emitted from upper surfaces of three diffusion layers having respective different thicknesses when lower surfaces of the respective diffusion layers are locally irradiated (in a spot-like manner) with laser light condensed by a condenser lens in a light emitting device made in accordance with principles of the presently disclosed subject matter.
Figure 5B:
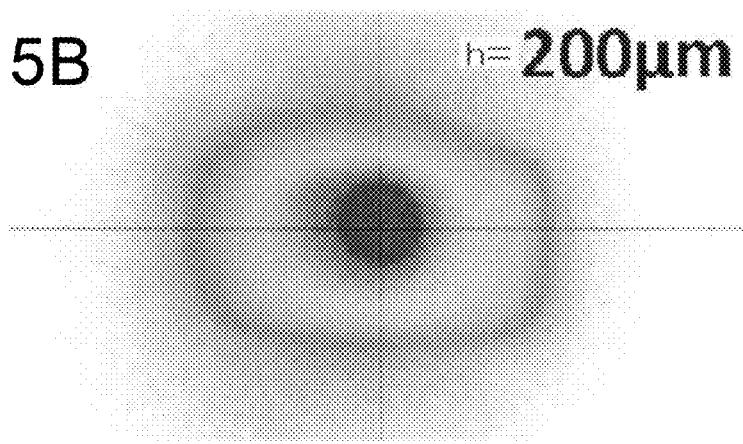
Figure 5C:
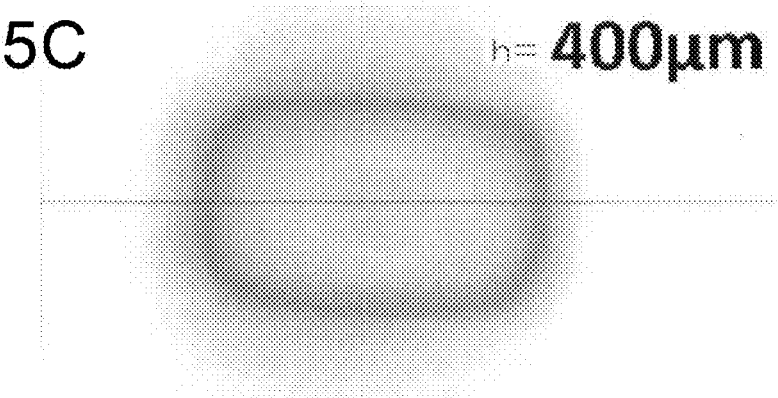

FIGS. 5A to 5C show the luminance distributions of the diffusion light emitted from the upper surfaces 36b of three diffusion layers 36 having respective different thicknesses h when the lower surface 36a (center) of each diffusion layer 36 was locally irradiated (in a spot-like manner) with laser light condensed by the condenser lens 16. The diffusion layers 36 were made of a composite body of YAG (25%), not doped with cerium (Ce) or other activators, and alumina $Al_2O_3$ (75%). The diffusion layer was formed to have a rectangular plate shape with a size of 0.4 mm×0.8 mm. The laser light from the semiconductor light emitting element 14 condensed by the condenser lens 16 was adjusted to an elliptical spot size of approximately 100 μm long and approximately 20 μm to 30 μm across. The side surfaces of the diffusion layers 36 were covered with a high reflectance member, for example, a white resin.

Referring to FIGS. 5A to 5C, it can be seen that luminance variations improve gradually as the thickness h of the diffusion layer 36 increases from 100 μm (see FIG. 5A) to 200 μm (see FIG. 5B) to 400 μm (see FIG. 5C). The luminance distribution becomes uniform (or generally uniform) at the thickness h=400 μm. The reason is that as the thickness h of the diffusion layer 36 increases, the number of times of scattering (the number of times of scattering due to a difference in refractive index between YAG and alumina $Al_2O_3$) of the laser light condensed by the condenser lens 16 (and luminescence caused by the laser light) in the diffusion layer 36 increases to make the laser light more uniform. Such uniformed laser light (and luminescence caused by the laser light) is emitted from the upper surface 36b of the diffusion layer 36.

From the foregoing, it is shown that the thickness h of the diffusion layer 36 can be increased to improve luminance variations of the diffusion light emitted from the upper surface 36b of the diffusion layer 36 and make the luminance distribution uniform (or generally uniform).

Based on the above finding, the thickness h of the diffusion layer 36 can be set to a thickness such that the diffusion light emitted from the upper surface 36b of the diffusion layer 36 has a uniform (or generally uniform) luminance distribution. Accordingly, in the present embodiment, h preferably falls within the range of 300 μm to 400 μm. Note that the thickness h of the diffusion layer 36 is not limited to 300 μm to 400 μm and may have other values as long as the diffusion effect is obtained.

The diffusion layer 36 having the above configuration can suppress a drop in efficiency due to luminance saturation and temperature quenching. The reason is that the light from the semiconductor light emitting element 14 (in the present embodiment, laser light) condensed by the condenser lens 16 is not incident on the wavelength conversion layer 38 (lower surface 38a) as local light. Instead, the light is diffused by the diffusion layer 36 and incident on the wavelength conversion layer 38 (lower surface 38a) as diffusion light having a generally uniform luminance distribution.

As shown in FIG. 4, the wavelength conversion layer 38 can be a layer including the lower surface 38a (corresponding to the third surface according to the presently disclosed subject matter) joined to the upper surface 36b of the diffusion layer 36 and an upper surface 38b (corresponding to the fourth surface according to the presently disclosed subject matter) on the opposite side. The wavelength conversion layer 38 can convert the wavelength of the diffusion light from the diffusion layer 36 incident on the lower surface 38a, and can emit the resultant from the upper surface 38b.

For example, the wavelength conversion layer 38 can be a layer with a rectangular plate shape (for example, a rectangle of 0.4 mm×0.8 mm with a thickness of 80 μm), made of a composite body (for example, sintered body) of activator-doped YAG and alumina $Al_2O_3$. Examples of the activator include cerium (Ce).

The diffusion layer 36 and the wavelength conversion layer 38 can be fixed (joined) so that the upper surface 36b of the diffusion layer 36 and the lower surface 38a of the wavelength conversion layer 38 are in surface contact with each other. For example, if the diffusion layer 36 and the wavelength conversion layer 38 are both made of ceramics, the diffusion layer 36 (upper surface 36b) and the wavelength conversion layer 38 (lower surface 38a) can be fixed (joined) by high-temperature curing the upper surface 36b of the diffusion layer 36 and the lower surface 38a of the wavelength conversion layer 38 in surface contact with each other. If the wavelength conversion layer 38 is a glass phosphor layer, the diffusion layer 36 (upper surface 36b) and the wavelength conversion layer 38 (lower surface 38a) can be fixed (joined) by curing the upper surface 36b of the diffusion layer 36 and the lower surface 38a of the wavelength conversion layer 38 in surface contact with each other.

The wavelength conversion layer 38 may be any layer that can convert the wavelength of the diffusion light from the diffusion layer 36 incident on the lower surface 38a and can emit the resultant from the upper surface 38b. The shape of the wavelength conversion layer 38 is not limited to the foregoing.

For example, the wavelength conversion layer 38 may be a circular columnar layer (for example, φ0.4 mm to 0.8 mm). The wavelength conversion layer 38 may be a rectangular solid layer (for example, 0.3 mm to 0.6 mm across and 0.6 mm to 2.0 mm long). Layers of other shapes may be used.

The wavelength conversion layer 38 may be any layer that can convert the wavelength of the diffusion light from the diffusion layer 36 incident on the lower surface 38a and can emit the resultant from the upper surface 38b. The material of the wavelength conversion layer 38 is not limited to the foregoing.

For example, the wavelength conversion layer 38 may be a layer of a composite body of activator-doped YAG and a glass binder. Examples of the activator include cerium (Ce). Layers of other materials may be used.

As shown in FIG. 4, the high reflectance member 18 can be a high reflectance member such as a white resin, which is arranged in a space surrounded by the recess 30 (bottom surface 30a and inner wall 30b), the light-transmitting member 12 (side surfaces 12a), and the foil body 20. For example, the high reflectance member 18 can be filled into the space by a dispenser until the high reflectance member 18 becomes flush with the top surface of the light-transmitting member 12 (the upper surface 38b of the wavelength conversion layer 38). The high reflectance member 18 can thus cover at least part of the side surfaces 12a of the light-transmitting member 12. This improves the light output efficiency. The reason is that since the side surfaces 12a of the light-transmitting member 12 are covered with the high reflectance member 18, light emitted from the side surfaces 12a of the light-transmitting member 12 is reflected from the high reflectance member 18 to enter the light-transmitting member 12 again. As a result, the light output efficiency improves as compared to when the side surfaces 12a of the light-transmitting member 12 are not covered with the high reflectance member 18. If the light output efficiency need not be improved, the high reflectance member 18 may be omitted.

The high reflectance member 18 can be held in the space so as to be less likely to fall off. The reason is that the high reflectance member 18 is in close contact with the inner wall 30b and the bottom surface 30a of the recess 30 and the side surfaces 12a of the light-transmitting member 12.

The high reflectance member 18 has only to cover at least part of the side surfaces 12a of the light-transmitting member 12. The high reflectance member 18 may fill the entire space (see FIG. 4) or some of the space (see FIG. 6).

The side surfaces 12a of the light-transmitting member 12 are not firmly fixed but covered with the high reflectance member 18 (for example, a white resin) which has elasticity. Each time the light-transmitting member 12 expands/contracts, the high reflectance member 18 (for example, a white resin) makes an elastic deformation to follow the expansion/contraction. This can suppress the application of stress to the light-transmitting member 12. As a result, the embrittlement of the light-transmitting member 12 (and the resulting break of the light-transmitting member 12) can be suppressed.

As shown in FIG. 4, the recess 30 can be covered with the foil body 20.

Figure 7:
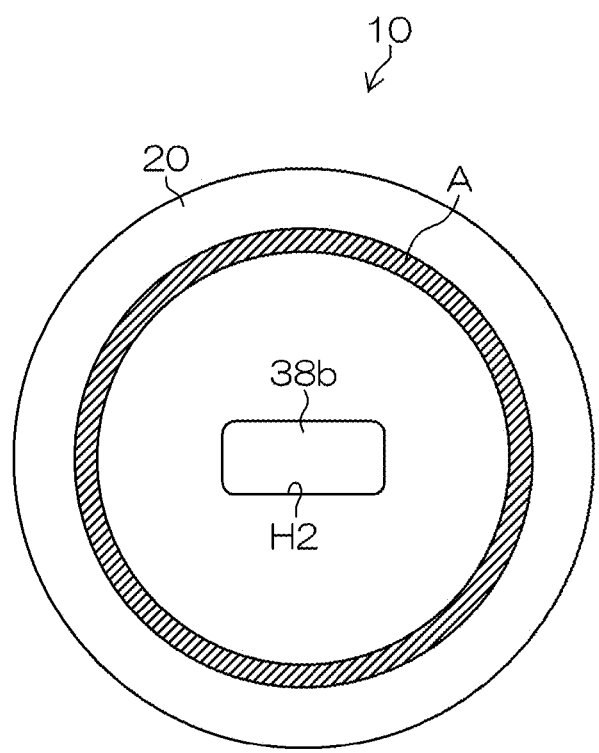
FIG. 7 is a top view of the light emitting device of FIG. 6.

FIG. 7 is a top view of the light emitting device 10.

Figure 6:
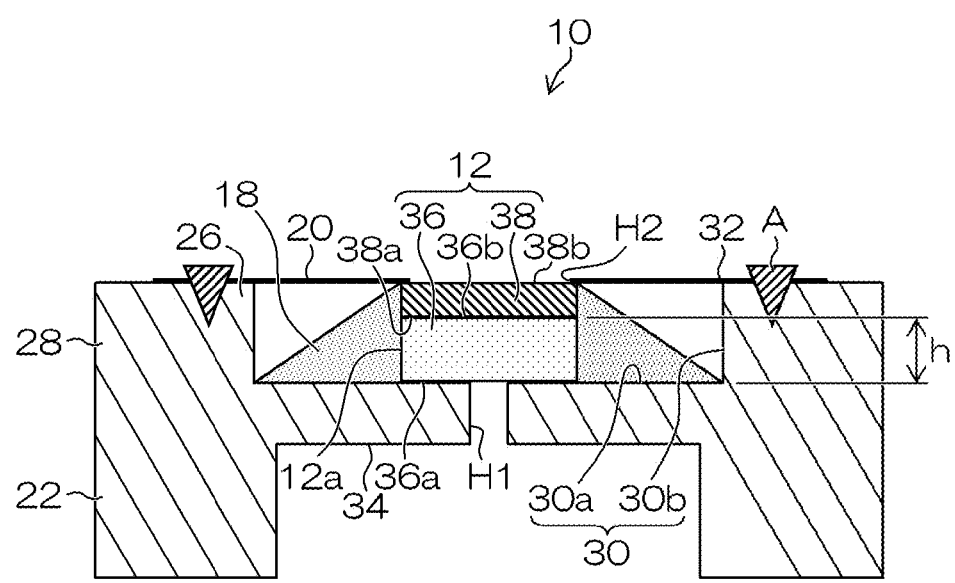
FIG. 6 is a longitudinal sectional view of a light emitting device (modification) made in accordance with principles of the presently disclosed subject matter.

As shown in FIGS. 3 and 6, the foil body 20 can be a foil body that can include a second through hole H2 for the light emitted from the light-transmitting member 12 (the upper surface 38b of the wavelength conversion layer 38) to pass through, and can have elasticity (spring characteristic) like a Belleville spring. The light-transmitting member 12 can be sandwiched between the foil body 20 around the second through hole H2 and the base portion 26 (the bottom surface 30a of the recess 30), with part of the light-transmitting member 12 (the upper surface 38b of the wavelength conversion layer 38) exposed from the second through hole H2 (see FIG. 4).

Examples of the foil body 20 may include metal foil such as stainless steel foil. Copper foil and aluminum foil having a thermal conductivity higher than that of stainless steel foil may be used. At thicknesses below 0.01 mm, the foil body 20 has little elasticity. At thicknesses above 0.1 mm, part of the light emitted from the light-transmitting member 12 through the second through hole H2 of the foil body 20 can be blocked by the inner wall of the second through hole H2. This may lower the light output efficiency. Consequently, the foil body 20 desirably has a thickness of 0.01 mm to 0.1 mm, and preferably 0.01 mm to 0.05 mm.

The foil body 20 may be metal foil having a relatively high thermal conductivity (such as copper foil and aluminum foil). Such a foil body 20 can provide a heat dissipation path for the heat generated by the locally irradiating light from the semiconductor light emitting element 14. As a result, the phosphor excitation efficiency can be increased.

For example, the foil body 20 and the base portion 26 can be fixed by welding (resistance welding, YAG welding, and the like). Resistance welding may be used to weld part of the foil body 20 inside its outer rim to the base portion 26. FIGS. 3 and 6 show an example where part (annular part) of the foil body 20 inside the outer rim can be fixed to the base portion 26 (surface 32) by resistance welding. In FIGS. 3 and 6, the welding trace of the resistance welding is designated by the symbol A. YAG welding may be used to weld the outer rim of the foil body 20 to the base portion 26.

The foil body 20 welded as described above is in close contact with the light-transmitting member 12 (near the outer periphery of the upper surface 38b of the wavelength conversion layer 38) and the high reflectance member 18 at room temperature (see FIG. 4).

The foil body 20 of the foregoing configuration can make an elastic deformation to follow expansion/contraction of the high reflectance member 18 (for example, white resin) each time the high reflectance member 18 expands/contracts because of the heat generated by the locally irradiating light from the semiconductor light emitting element 14 (for example, semiconductor laser light source). The foil body 20 can therefore securely hold the light-transmitting member 12.

The foil body 20 has only to have elasticity, and is not limited to the foregoing. For example, aside from metal foil, the foil body 20 may be a graphite sheet having an extremely high thermal conductivity. Foil of other materials may be used.

The foil body 20 may have the same thickness overall. The foil body 20 may have different thicknesses in part. For example, the foil body 20 may have a greater thickness in the portion to be welded than in the other portions. This can secure a greater welding margin, so that the foil body 20 and the base portion 26 can be more firmly welded (fixed) to each other.

The foil body 20 may have a greater thickness around the through hole 2 (the portion to press the light-transmitting member 12) that in the other portions. The foil body 20 may be made thinner in a portion where elasticity is needed than in the other portions.

For example, the foil body 20 can be manufactured by the following manner.

Initially, rolled metal foil (for example, stainless steel foil) is manufactured. The metal foil desirably has a thickness of 0.01 mm to 0.1 mm, and preferably 0.01 mm to 0.05 mm.

The rolled metal foil is then cut into a predetermined shape. For example, according to the shape of the base portion 26 (for example, circular shape), the metal foil is cut into a circular shape.

Next, a second through hole H2 of desired shape is formed in the cut metal foil of the predetermined shape, for example, by press punching.

In such a manner, the foil body 20 including the second through hole H2 can be manufactured.

Figure 8A:
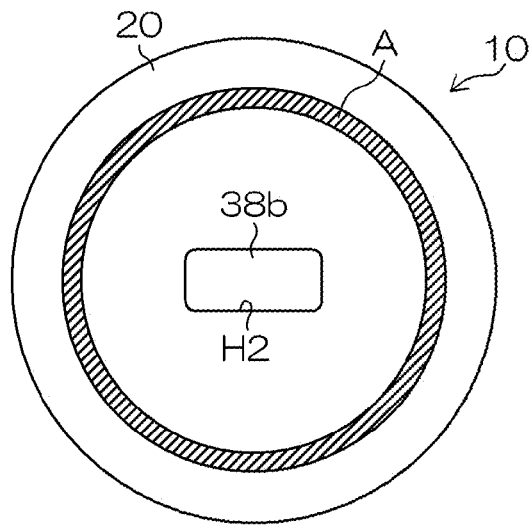
FIGS. 8A to 8C are diagrams illustrating examples of a second through hole formed in the foil body made in accordance with principles of the presently disclosed subject matter.
Figure 8B:
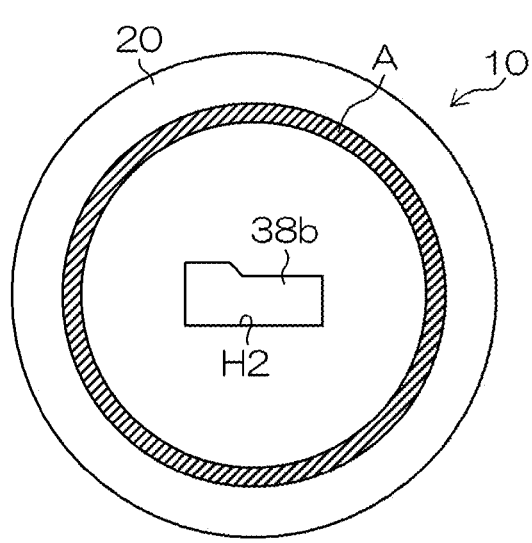
Figure 8C:
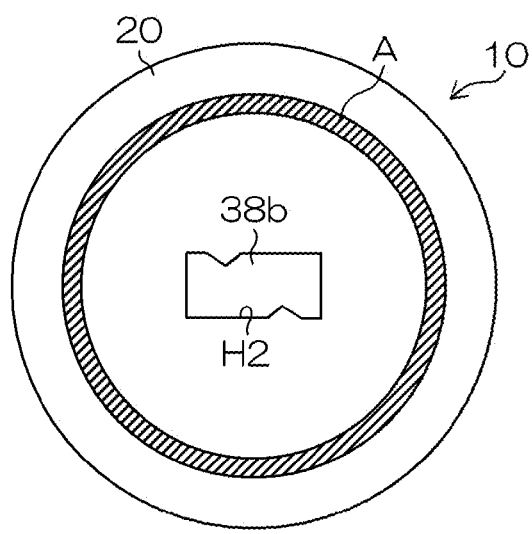

FIGS. 8A to 8C show examples of the second through hole H2 formed in the foil body 20.

Forming the second through hole H2 in an arbitrary shape (for example, see FIGS. 8A to 8C) can form a light emitting surface (constituted by part of the upper surface 38b of the wavelength conversion layer 38 exposed from the second through hole H2) of arbitrary shape. The outline of the light emitting surface is defined by the shape of the second through hole H2.

For example, the second through hole H2 may be formed in an appropriate shape (for example, see FIGS. 8A to 8C) according to the shape, size, and the like of the intended light distributed pattern. In such a manner, a light emitting surface having a shape suitable for a desired light distribution pattern (for example, low-beam light distribution pattern) can be easily formed.

FIG. 8A shows an example where the second through hole H2 is formed in a horizontal rectangular shape. Such a shape is intended to constitute a light emitting surface equivalent to a horizontal rectangular one used for a typical projector type vehicle headlight etc.

FIG. 8B shows an example where the second through hole H2 is formed in a horizontal rectangular shape with a step portion corresponding to a cutoff line in either one of long sides. Such a shape is intended to constitute a light emitting surface suitable to form a low-beam light distribution pattern including a cutoff line at the upper edge.

FIG. 8C shows an example where the second through hole H2 is formed in a horizontal rectangular shape with notched portions on both long sides.

The shape of the second through hole H2 is not limited to the foregoing. For example, circular, elliptical, and various other shapes may be used.

FIGS. 9A to 9E show modifications of the foil body 20.

Figure 9A:
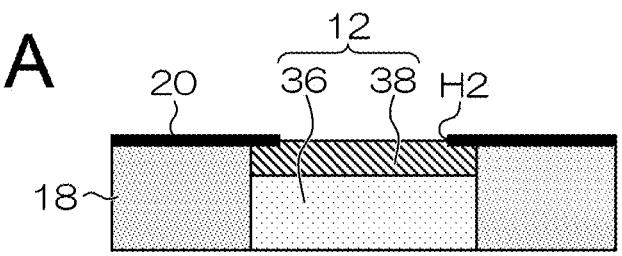
FIGS. 9A to 9E are diagrams illustrating modifications of the foil body made in accordance with principles of the presently disclosed subject matter.
Figure 9B:
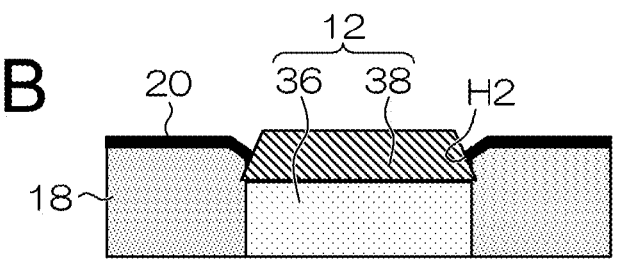

The foil body 20 is not limited to a flat shape like shown in FIGS. 4 and 9A. For example, as shown in FIG. 9B, the foil body 20 may be pressed or squeezed around the second through hole H2 so that the foil body 20 has a convex shape (or concave shape) around the second through hole H2.

With such a configuration, the light-transmitting member 12 can be sandwiched from both the side surfaces 12a.

Figure 9C:
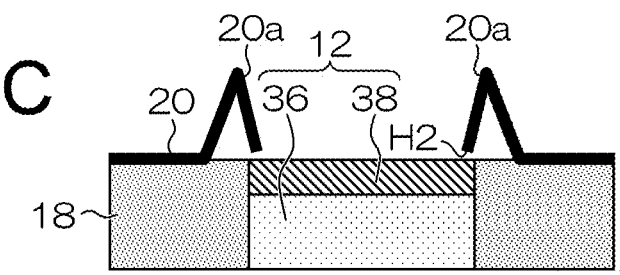
Figure 9D:
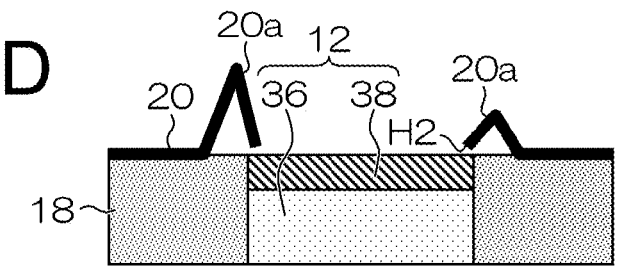

As shown in FIGS. 9C and 9D, the foil body 20 may include reflection surfaces 20a for controlling the light passing through the second through hole H2. With such a configuration, the distribution of the light passing through the second through hole H2 can be controlled to an intended direction to form an intended light distribution pattern (for example, low-beam light distribution pattern).

FIGS. 9C and 9D show examples where the foil body 20 and the reflection surfaces 20a are integrally formed. The foil body 20 (metal foil) is bent in the portions continuous with the periphery of the second through hole H2, whereby the reflection surfaces 20a for controlling the light passing through the second through hole H2 are formed around the second through hole H2. For higher reflectance, mirror finishing (for example, aluminum deposition) may be applied to the portions used as the reflection surfaces 20a. Alternatively, additional mirror members may be bonded to the portions by adhesion etc.

Figure 9E:
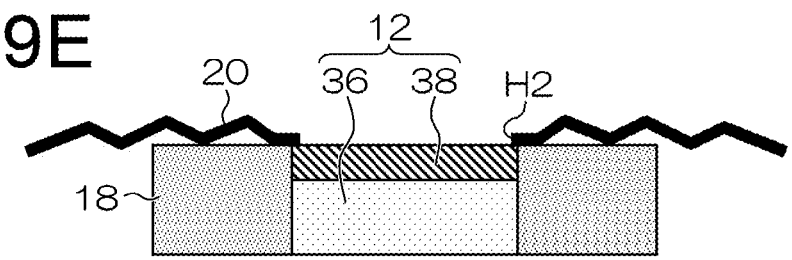

As shown in FIG. 9E, the foil body 20 may be shaped to include curved portions (for example, accordion-like curved portions) for improved elasticity.

The second holder 40 can be made of metal such as stainless steel. As shown in FIG. 3, the second holder 40 can include a cylindrical tube portion 42, an upper flange portion 44 arranged around an upper part of the tube portion 42, and a lower flange portion 46 arranged around a lower part of the tube portion 42.

The first holder 22 can be fixed to the second holder 40 so that the tube portion 24 is inserted into the tube portion 42 of the holder 40 through a top opening of the tube portion 42, with the flange portion 28 of the first holder 22 and the top end of the tube portion 42 of the second holder 40 in contact with each other.

The semiconductor light emitting element 14 can be a semiconductor light emitting element that emits light to pass through the first through hole H1 and for the light-transmitting member 12 (the lower surface 36a of the diffusion layer 36) to be irradiated with. Examples of the semiconductor light emitting element 14 may include a semiconductor laser light source such as a laser diode (LD) having a blue emission wavelength (around 450 nm). In the present embodiment, as shown in FIG. 3, the semiconductor light emitting element 14 can be packaged to constitute a can-type semiconductor laser light source 14A.

The semiconductor light emitting element 14 is not limited to a laser diode, and may be a light-emitting diode (LED). The emission wavelength of the semiconductor light emitting element 14 is not limited to the blue region (around 450 nm). For example, a near ultraviolet region (around 405 nm) may be used. If the semiconductor light emitting element 14 has an emission wavelength in the near ultraviolet region (around 405 nm), the wavelength conversion layer 38 can use three color phosphors in blue, green, and red, or two color phosphors in blue and yellow.

The semiconductor laser light source 14A can be inserted into the tube portion 42 of the second holder 40 through a bottom opening of the tube portion 42. The semiconductor laser light source 14A can be fixed to the second holder 40 so that a flange portion 14A1 of the semiconductor laser light source 14A and a step portion 42a of the tube portion 42 are in contact with each other.

The condenser lens 16 can be an optical system that can condense the light from the semiconductor light emitting element 14 and can locally irradiate the light-transmitting member 12 (the lower surface 36a of the diffusion layer 36) with the light. The condenser lens 16 can be held by the second older 40 and arranged between the light-transmitting member 12 and the semiconductor light emitting element 14.

In the light emitting device 10 having the above configuration, the light from the semiconductor light emitting element 14 can be condensed by the condenser lens 16 and can pass through the first through hole H1. The light-transmitting member 12 (the lower surface 36a of the diffusion layer 36) located at a distance from the semiconductor light emitting element 14 can be locally irradiated (in a spot-like manner) with the light. The spot size can be adjusted, for example, to an elliptical shape of approximately 100 μm long and approximately 20 μm to 30 μm across. The light with which the light-transmitting member 12 (the lower surface 36a of the diffusion layer 36) is locally irradiated (in a spot-like manner) can be diffused inside the diffusion layer 36 and emitted from the upper surface 36b of the diffusion layer 36 as diffusion light having a uniform (or generally uniform) luminance distribution. The diffusion light can be incident on the lower surface 38a of the wavelength conversion layer 38.

The wavelength conversion layer 38 on which the diffusion light from the diffusion layer 36 is incident can emit white light. The white light can be obtained by color mixture of the transmitted diffusion light from the diffusion layer 36 and light (luminescence) that is emitted due to excitation by the diffusion light from the diffusion layer 36. The white light can pass through the second through hole H2 formed in the foil body 20 and can be taken outside.

As has been described above, the light emitting device 10 according to the present embodiment can provide the following advantages.

Firstly, the light-transmitting member 12 can be prevented from falling off even if the adhesive or the like bonding the light-transmitting member 12 (the lower surface 36a of the diffusion layer 36) to the surface 32 (the bottom surface 30a of the recess 30) degrades. This advantage results from the fact that the light-transmitting member 12 is sandwiched between the foil body 20 (around the second through hole H2) and the base portion 26 (see FIG. 3).

Secondly, the embrittlement of the light-transmitting member 12 (and the resulting breaking of the light-transmitting member 12) can be suppressed while the light-transmitting member 12 repeats expansion and contraction because of heat generated by the locally irradiating light from the semiconductor light emitting element 14 (for example, semiconductor laser light source). This advantage results from the fact that the elastic foil body 20 is used as a member for sandwiching (fixing) the light-transmitting member 12.

More specifically, suppose that the light-transmitting member 12 is firmly fixed by using a member having no elasticity (or member having little elasticity) as the member for sandwiching (fixing) the light-transmitting member 12. In such a case, the light-transmitting member 12 undergoes stress each time the light-transmitting member 12 expands/contracts. As a result, the embrittlement of the light-transmitting member 12 (and the resulting breaking of the light-transmitting member 12) is facilitated.

In contrast, according to the light emitting device 10 of the present embodiment, the elastic foil body 20 is used as the member for sandwiching (fixing) the light-transmitting member 12. Each time the light-transmitting member 12 expands/contacts, the foil body 20 can make an elastic deformation to follow the expansion/contraction, whereby the application of stress to the light-transmitting member 12 can be suppressed. Consequently, the embrittlement of the light-transmitting member 12 (and the resulting breaking of the light-transmitting member 12) can be suppressed.

Thirdly, the light output efficiency can be increased. This advantage results from the fact that the foil body 20 having a substantially negligible thickness is used as the member for sandwiching (fixing) the light-transmitting member 12.

More specifically, suppose that the light-transmitting member 12 is sandwiched (fixed) by using a member having more than a certain thickness. In such a case, part of the light emitted from the light-transmitting member 12 through the second through hole H2 is blocked by the inner wall of the second through hole H2. This lowers the light output efficiency.

In contrast, according to the light emitting device 10 of the present embodiment, the foil body 20 having a substantially negligible thickness can be used as the member for sandwiching (fixing) the light-transmitting member 12. The light emitted from the light-transmitting member 12 through the second through hole H2 will hardly be blocked by the inner fall of the second through hole H2. As a result, the light output efficiency can be increased.

Fourthly, the second through hole H2 can be formed in an arbitrary shape. This advantage results from the fact that the second through hole H2 is formed in the foil body 20 which is easily processable.

Fifthly, a light emission surface having an arbitrary shape (constituted by part of the upper surface 38b of the wavelength conversion layer 38 exposed from the second through hole H2) can be formed. The outline of the light emission surface is defined by the shape of the second through hole H2.

For example, the second through hole H2 can be formed in an appropriate shape (for example, see FIGS. 8A to 8C) according to the shape, size, and the like of an intended light distribution pattern. In such a manner, a light emission surface having a shape suitable for a predetermined light distribution pattern (for example, low-beam light distribution pattern) can be easily formed.

Next, a modification will be described.

Figure 10:
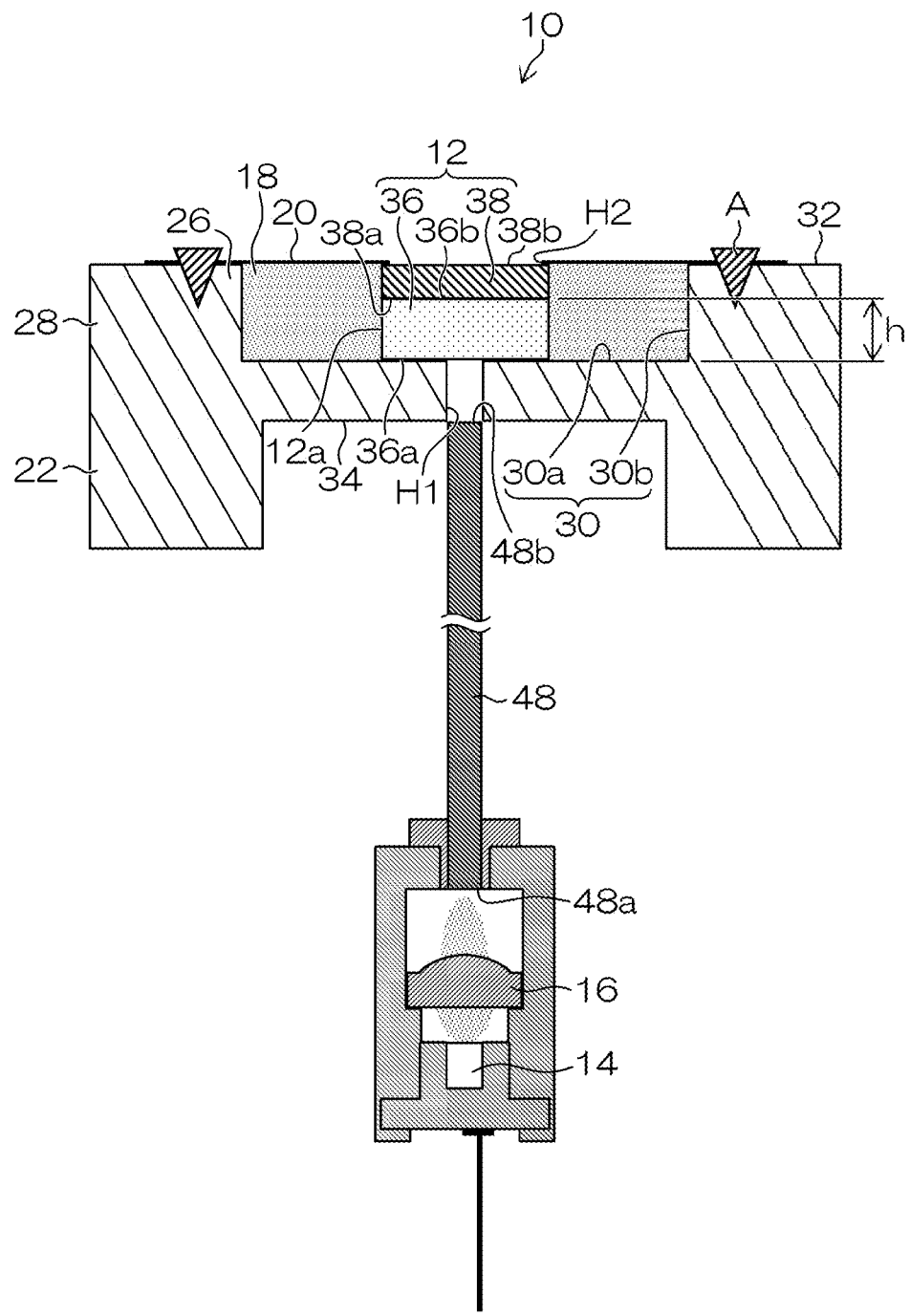
FIG. 10 is a longitudinal sectional view of a light emitting device (modification) made in accordance with principles of the presently disclosed subject matter.

FIG. 10 is a longitudinal section view of a light emitting device 10 (modification).

In the foregoing embodiment, the condenser lens 16 (see FIG. 3) has been described as the optical system for condensing the light from the semiconductor light emitting element 14 and locally irradiating the light-transmitting member 12 (the lower surface 36a of the diffusion layer 36) with the light. The presently disclosed subject matter is not limited thereto.

For example, the condenser lens 16 serving as the optical system for condensing the light from the semiconductor light emitting element 14 and locally irradiating the light-transmitting member 12 (the lower surface 36a of the diffusion layer 36) with the light may be replaced with an optical system such as shown in FIG. 10. The optical system shown in FIG. 10 can include the condenser lens 16 and a light guide 48. The condenser lens 16 can condense the light from the semiconductor light emitting element 14. The light guide 48 can guide the light from the semiconductor light emitting element 14 condensed by the condenser lens 16 and can locally irradiate the light-transmitting member 12 (the lower surface 36a of the diffusion layer 36) with the light.

Examples of the light guide 48 may include an optical fiber having a center core (for example, with a core diameter of 0.2 mm) and a surrounding clad, neither of which is shown. The core has a refractive index higher than that of the clad. The laser light introduced into the light guide 48 through an end 48a of the light guide 48 (the laser light from the semiconductor light emitting element 14 condensed by the condenser lens 16) can be guided to the other end 48b of the light guide 48 as confined within the core by utilizing the total reflection at the interface between the core and the clad. The light can be emitted from the other end 48b, and the light-transmitting member 12 (the lower surface 36a of the diffusion layer 36) located at a distance from the semiconductor light emitting element 14 can be locally irradiated with the light.

The light with which the lower surface 36a of the diffusion layer 36 is locally irradiated (in a spot-like manner) can be diffused inside the diffusion layer 36 and emitted from the upper surface 36b of the diffusion layer 36 as diffusion light having a uniform (or generally uniform) luminance distribution. The diffusion light can be incident on the lower surface 38a of the wavelength conversion layer 38.

The wavelength conversion layer 38 on which the diffusion light from the diffusion layer 36 is incident can emit white light. The white light can be caused by color mixture of the transmitted diffusion light from the diffusion layer 36 and light that is emitted due to excitation by the diffusion light from the diffusion layer 36. The white light can pass through the second through hole H2 of the foil body 20 and can be taken outside.

The light emitting device 10 of the present modification can provide the same effects as those of the foregoing embodiment.

Next, examples of a vehicle lamp (for example, vehicle headlight) using the light emitting device 10 having the above configuration will be described.

Figure 11:
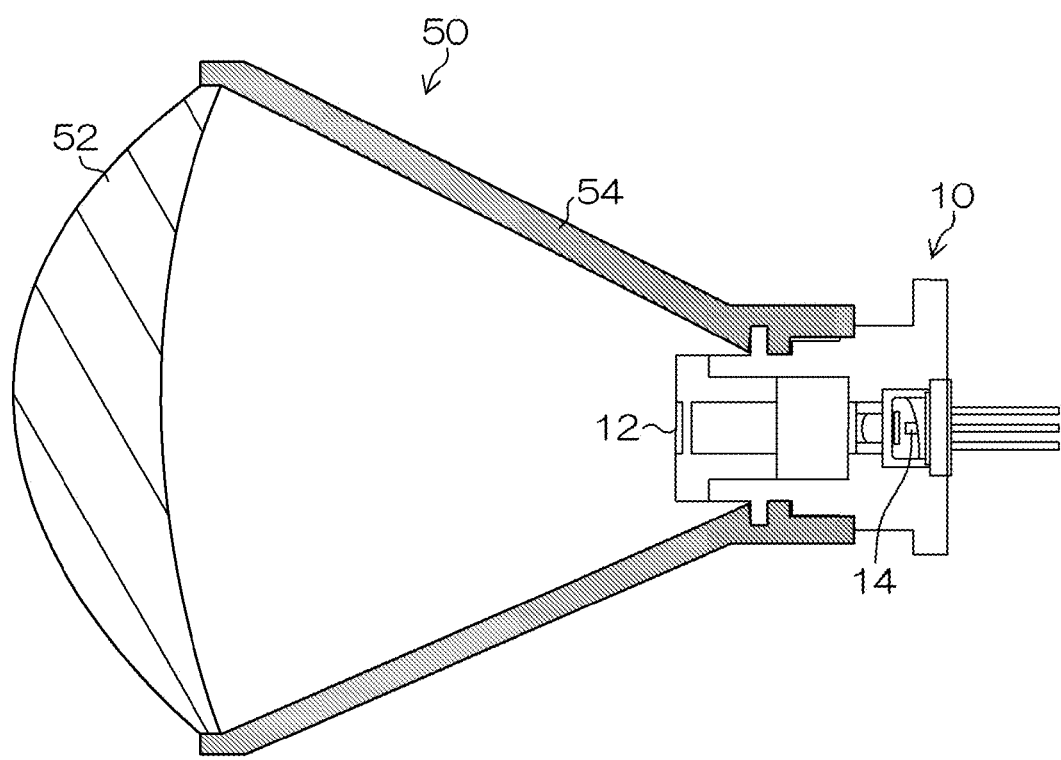
FIG. 11 is a diagram illustrating a configuration example of a vehicle lamp of so-called direct projection type (also referred to as direct emission type) made in accordance with principles of the presently disclosed subject matter and which includes a projection lens as an optical system configured to control the light from the light emitting device to irradiate in front of a vehicle.

FIG. 11 shows an example of a vehicle lamp 50 of so-called direct projection type (also referred to as direct emission type). The vehicle lamp 50 can employ a projection lens 52 as an optical system configured to control the light from the light emitting device 10 and irradiate in front of the vehicle. The projection lens 52 and the light emitting device 10 arranged behind the projection lens 52 can be held in a predetermined positional relationship by a holder 54.

Figure 12:
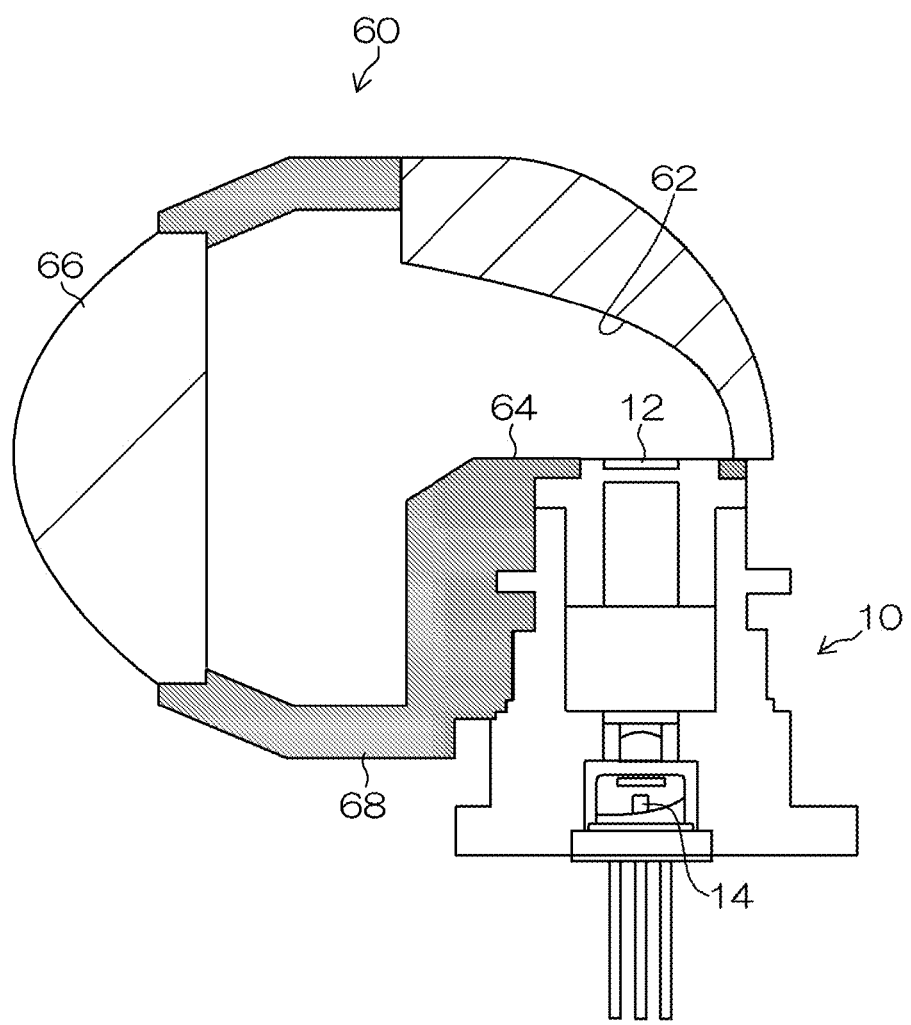
FIG. 12 is a diagram illustrating a configuration example of a vehicle lamp of so-called projector type made in accordance with principles of the presently disclosed subject matter and which includes a reflection surface, a shade, and a projection lens as the optical system configured to control the light from the light emitting device to irradiate in front of a vehicle.

FIG. 12 shows an example of a vehicle lamp 60 of so-called projector type. The vehicle lamp 60 can include a reflection surface 62, a shade 64, and a projection lens 66 as the optical system configured to control the light from the light emitting device 10 and irradiate in front of the vehicle. The reflection surface 62, the shade 64, the projection lens 66, and the light emitting device 10 can be held in a predetermined positional relationship by a holder 68.

Aside from vehicle lamps, the light emitting device 10 may be used, for example, as a projection light, indoor lighting, outdoor lighting, and a projector light source.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A light emitting device comprising:
   a base portion including a surface, a back surface on an opposite side with respect to the surface, and a first through hole penetrating the surface and the back surface;
   a light-transmitting member fixed to the surface so as to cover the first through hole;
   a semiconductor light emitting element configured to emit light to pass through the first through hole and for the light-transmitting member to be irradiated with;
   an optical system configured to condense the light from the semiconductor light emitting element and locally irradiate the light-transmitting member with the light; and
   a foil body including a second through hole for light emitted from the light-transmitting member to pass through and which has elasticity, the light-transmitting member being sandwiched between the foil body around the second through hole and the base portion with part of the light-transmitting member exposed from the second through hole.

2. The light emitting device according to claim 1, further comprising a high reflectance member configured to cover at least part of a side surface of the light-transmitting member.

3. The light emitting device according to claim 2, wherein the high reflectance member is a white resin.

4. The light emitting device according to claim 1, wherein
   the surface includes a recess including a bottom surface in which the first through hole is formed;
   the light-transmitting member is fixed to the bottom surface of the recess so as to cover the first through hole; and
   a high reflectance member is arranged in a space defined by an inner wall and the bottom surface of the recess, the side surface of the light-transmitting member, and the foil body.

5. The light emitting device according to claim 2, wherein:
   the surface includes a recess including a bottom surface in which the first through hole is formed;
   the light-transmitting member is fixed to the bottom surface of the recess so as to cover the first through hole; and
   the high reflectance member is arranged in a space defined by an inner wall and the bottom surface of the recess, the side surface of the light-transmitting member, and the foil body.

6. The light emitting device according to claim 3, wherein:
   the surface includes a recess including a bottom surface in which the first through hole is formed;
   the light-transmitting member is fixed to the bottom surface of the recess so as to cover the first through hole; and
   the high reflectance member is arranged in a space defined by an inner wall and the bottom surface of the recess, the side surface of the light-transmitting member, and the foil body.

7. The light emitting device according to claim 1, wherein
   the light-transmitting member is a wavelength conversion member including a diffusion layer and a wavelength conversion layer;
   the diffusion layer includes a first surface fixed to the surface so as to cover the first through hole and a second surface on an opposite side of the first surface, the diffusion layer is configured to diffuse the light from the semiconductor light emitting element with which the first surface is irradiated, so as to emit light as diffusion light from the second surface; and
   the wavelength conversion layer includes a third surface joined to the second surface and a fourth surface on an opposite side of the third surface, the wavelength conversion layer configured to convert a wavelength of the diffusion light incident on the third surface, so as to emit light from the fourth surface.

8. The light emitting device according to claim 2, wherein
   the light-transmitting member is a wavelength conversion member including a diffusion layer and a wavelength conversion layer;
   the diffusion layer includes a first surface fixed to the surface so as to cover the first through hole and a second surface on an opposite side of the first surface, and the diffusion layer is configured to diffuse the light from the semiconductor light emitting element with which the first surface is irradiated, so as to emit light as diffusion light from the second surface; and
   the wavelength conversion layer includes a third surface joined to the second surface and a fourth surface on an opposite side of the third surface, the wavelength conversion layer configured to convert a wavelength of the diffusion light incident on the third surface, so as to emit light from the fourth surface.

9. The light emitting device according to claim 3, wherein the light-transmitting member is a wavelength conversion member including a diffusion layer and a wavelength conversion layer;

the diffusion layer includes a first surface fixed to the surface so as to cover the first through hole and a second surface on an opposite side of the first surface, and the diffusion layer is configured to diffuse the light from the semiconductor light emitting element with which the first surface is irradiated, so as to emit light as diffusion light from the second surface; and the wavelength conversion layer includes a third surface joined to the second surface and a fourth surface on an opposite side of the third surface, and the wavelength conversion layer is configured to convert a wavelength of the diffusion light incident on the third surface, so as to emit light from the fourth surface.

10. The light emitting device according to claim 4, wherein the light-transmitting member is a wavelength conversion member including a diffusion layer and a wavelength conversion layer;

the diffusion layer includes a first surface fixed to the surface so as to cover the first through hole and a second surface on an opposite side of the first surface, and the diffusion layer is configured to diffuse the light from the semiconductor light emitting element with which the first surface is irradiated, so as to emit light as diffusion light from the second surface; and the wavelength conversion layer includes a third surface joined to the second surface and a fourth surface on an opposite side of the third surface, and the wavelength conversion layer is configured to convert a wavelength of the diffusion light incident on the third surface, so as to emit light from the fourth surface.

11. The light emitting device according to claim 5, wherein the light-transmitting member is a wavelength conversion member including a diffusion layer and a wavelength conversion layer;

the diffusion layer includes a first surface fixed to the surface so as to cover the first through hole and a second surface on an opposite side of the first surface, and the diffusion layer is configured to diffuse the light from the semiconductor light emitting element with which the first surface is irradiated, so as to emit light as diffusion light from the second surface; and the wavelength conversion layer includes a third surface joined to the second surface and a fourth surface on an opposite side of the third surface, and the wavelength conversion layer is configured to convert a wavelength of the diffusion light incident on the third surface, so as to emit light from the fourth surface.

12. The light emitting device according to claim 6, wherein the light-transmitting member is a wavelength conversion member including a diffusion layer and a wavelength conversion layer;

the diffusion layer includes a first surface fixed to the surface so as to cover the first through hole and a second surface on an opposite side of the first surface, and the diffusion layer is configured to diffuse the light from the semiconductor light emitting element with which the first surface is irradiated, so as to emit light as diffusion light from the second surface; and the wavelength conversion layer includes a third surface joined to the second surface and a fourth surface on an opposite side of the third surface, and the wavelength layer is configured to convert a wavelength of the diffusion light incident on the third surface, so as to emit light from the fourth surface.

13. The light emitting device according to claim 1, wherein the foil body is a metal foil.

14. The light emitting device according to claim 2, wherein the foil body is a metal foil.

15. The light emitting device according to claim 3, wherein the foil body is a metal foil.

16. The light emitting device according to claim 4, wherein the foil body is a metal foil.

17. The light emitting device according to claim 7, wherein the foil body is a metal foil.

18. The light emitting device according to claim 1, wherein the foil body includes a reflection surface configured to control the light passing through the second through hole.

19. The light emitting device according to claim 2, wherein the foil body includes a reflection surface configured to control the light passing through the second through hole.

20. The light emitting device according to claim 3, wherein the foil body includes a reflection surface configured to control the light passing through the second through hole.

21. The light emitting device according to claim 4, wherein the foil body includes a reflection surface configured to control the light passing through the second through hole.

22. The light emitting device according to claim 7, wherein the foil body includes a reflection surface configured to control the light passing through the second through hole.

23. The light emitting device according to claim 7, wherein the diffusion layer has a thickness set so that the diffusion light emitted from the second surface has a generally uniform luminance distribution.

24. The light emitting device according to claim 8, wherein the diffusion layer has a thickness set so that the diffusion light emitted from the second surface has a generally uniform luminance distribution.

25. The light emitting device according to claim 9, wherein the diffusion layer has a thickness set so that the diffusion light emitted from the second surface has a generally uniform luminance distribution.

26. The light emitting device according to claim 10, wherein the diffusion layer has a thickness set so that the diffusion light emitted from the second surface has a generally uniform luminance distribution.

27. The light emitting device according to claim 1, wherein the optical system includes a condenser lens configured to condense the light from the semiconductor light emitting element and locally irradiate the light-transmitting member with the light through the first through hole.

28. The light emitting device according to claim 1, wherein the optical system includes a condenser lens configured to condense the light from the semiconductor light emitting element, and a light guide configured to guide the light from the semiconductor light emitting element condensed by the condenser lens and locally irradiate the light-transmitting member with the light.

29. A vehicle lamp comprising:
the light emitting device according to claim 1; and
an optical system configured to control light from the light emitting device to irradiate light in front of a vehicle.

* * * * *